(12) United States Patent
Pagaila et al.

(10) Patent No.: US 9,640,504 B2
(45) Date of Patent: May 2, 2017

(54) SEMICONDUCTOR DEVICE AND METHOD OF PROVIDING Z-INTERCONNECT CONDUCTIVE PILLARS WITH INNER POLYMER CORE

(71) Applicant: STATS ChipPAC, Ltd., Singapore (SG)

(72) Inventors: Reza A. Pagaila, Tangerang (ID); Byung Tai Do, Singapore (SG); Shuangwu Huang, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 58 days.

(21) Appl. No.: 14/224,931

(22) Filed: Mar. 25, 2014

(65) Prior Publication Data

US 2014/0203443 A1   Jul. 24, 2014

Related U.S. Application Data

(60) Continuation of application No. 13/405,094, filed on Feb. 24, 2012, now Pat. No. 8,742,579, which is a (Continued)

(51) Int. Cl.
*H01L 23/52* (2006.01)
*H01L 23/00* (2006.01)
(Continued)

(52) U.S. Cl.
CPC ............ *H01L 24/18* (2013.01); *H01L 21/568* (2013.01); *H01L 21/6835* (2013.01);
(Continued)

(58) Field of Classification Search
None
See application file for complete search history.

(56) References Cited

U.S. PATENT DOCUMENTS

| 4,681,795 A | 7/1987 | Tuckerman |
| 5,250,843 A | 10/1993 | Eichelberger |

(Continued)

FOREIGN PATENT DOCUMENTS

WO    WO2007069606 A1 *  6/2007

*Primary Examiner* — Fei Fei Yeung Lopez
(74) *Attorney, Agent, or Firm* — Robert D. Atkins; Patent Law Group: Atkins and Associates, P.C.

(57) ABSTRACT

A semiconductor device is made by providing a sacrificial substrate and depositing an adhesive layer over the sacrificial substrate. A first conductive layer is formed over the adhesive layer. A polymer pillar is formed over the first conductive layer. A second conductive layer is formed over the polymer pillar to create a conductive pillar with inner polymer core. A semiconductor die or component is mounted over the substrate. An encapsulant is deposited over the semiconductor die or component and around the conductive pillar. A first interconnect structure is formed over a first side of the encapsulant. The first interconnect structure is electrically connected to the conductive pillar. The sacrificial substrate and adhesive layers are removed. A second interconnect structure is formed over a second side of the encapsulant opposite the first interconnect structure. The second interconnect structure is electrically connected to the conductive pillar.

20 Claims, 8 Drawing Sheets

Related U.S. Application Data division of application No. 12/406,049, filed on Mar. 17, 2009, now Pat. No. 8,133,762.

(51) Int. Cl.
- *H01L 23/528* (2006.01)
- *H01L 23/538* (2006.01)
- *H01L 21/56* (2006.01)
- *H01L 21/683* (2006.01)
- *H01L 23/31* (2006.01)
- *H01L 25/10* (2006.01)
- *H01L 25/16* (2006.01)

(52) U.S. Cl.
CPC ........ *H01L 23/3128* (2013.01); *H01L 23/528* (2013.01); *H01L 23/5283* (2013.01); *H01L 23/5389* (2013.01); *H01L 24/19* (2013.01); *H01L 24/97* (2013.01); *H01L 25/105* (2013.01); *H01L 25/16* (2013.01); *H01L 2221/68345* (2013.01); *H01L 2224/04105* (2013.01); *H01L 2224/12105* (2013.01); *H01L 2224/20* (2013.01); *H01L 2224/48091* (2013.01); *H01L 2224/73265* (2013.01); *H01L 2224/97* (2013.01); *H01L 2225/1035* (2013.01); *H01L 2225/1041* (2013.01); *H01L 2225/1058* (2013.01); *H01L 2924/0103* (2013.01); *H01L 2924/01004* (2013.01); *H01L 2924/014* (2013.01); *H01L 2924/01006* (2013.01); *H01L 2924/01013* (2013.01); *H01L 2924/01024* (2013.01); *H01L 2924/01029* (2013.01); *H01L 2924/01047* (2013.01); *H01L 2924/01061* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/04953* (2013.01); *H01L 2924/09701* (2013.01); *H01L 2924/12041* (2013.01); *H01L 2924/12042* (2013.01); *H01L 2924/12044* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/15331* (2013.01); *H01L 2924/181* (2013.01); *H01L 2924/1902* (2013.01); *H01L 2924/19041* (2013.01); *H01L 2924/19042* (2013.01); *H01L 2924/19043* (2013.01); *H01L 2924/30105* (2013.01)

(56) References Cited

U.S. PATENT DOCUMENTS

| | | |
|---|---|---|
| 5,353,498 A | 10/1994 | Fillion et al. |
| 5,381,039 A | 1/1995 | Morrison |
| 5,528,462 A | 6/1996 | Pendse |
| 5,764,486 A | 6/1998 | Pendse |
| 5,768,776 A | 6/1998 | Pendse |
| 5,818,114 A | 10/1998 | Pendse et al. |
| 5,841,193 A | 11/1998 | Eichelberger |
| 5,874,780 A | 2/1999 | Murakami |
| 5,920,200 A | 7/1999 | Pendse et al. |
| 5,987,744 A | 11/1999 | Lan et al. |
| 6,051,878 A * | 4/2000 | Akram .................... H05K 1/144 257/678 |
| 6,059,894 A | 5/2000 | Pendse |
| 6,159,420 A | 12/2000 | Akimoto |
| 6,417,573 B1 | 7/2002 | Pendse |
| 6,737,295 B2 | 5/2004 | Pendse et al. |
| 6,780,682 B2 | 8/2004 | Pendse |
| 6,784,530 B2 | 8/2004 | Sugaya et al. |
| 6,815,252 B2 | 11/2004 | Pendse |
| 6,815,254 B2 | 11/2004 | Mistry et al. |
| 6,828,220 B2 | 12/2004 | Pendse et al. |
| 6,940,178 B2 | 9/2005 | Kweon et al. |
| 6,995,041 B2 | 2/2006 | Connell et al. |
| 7,011,988 B2 | 3/2006 | Forcier |
| 7,033,859 B2 | 4/2006 | Pendse |
| 7,034,391 B2 | 4/2006 | Pendse |
| 7,057,269 B2 | 6/2006 | Karnezos |
| 7,446,419 B1 | 11/2008 | Lin et al. |
| 7,619,901 B2 | 11/2009 | Eichelberger et al. |
| 2001/0013853 A1 * | 8/2001 | Suzuki ........................... 345/92 |
| 2001/0038151 A1 | 11/2001 | Takahashi et al. |
| 2004/0145044 A1 | 7/2004 | Sugaya et al. |
| 2004/0178499 A1 | 9/2004 | Mistry et al. |
| 2004/0262774 A1 | 12/2004 | Kang et al. |
| 2005/0003578 A1 | 1/2005 | Wu |
| 2005/0077632 A1 | 4/2005 | Hedler et al. |
| 2005/0109455 A1 * | 5/2005 | Bai .............................. 156/292 |
| 2005/0161804 A1 | 7/2005 | Iijima et al. |
| 2005/0230848 A1 | 10/2005 | Nakatani et al. |
| 2005/0236709 A1 | 10/2005 | Eng et al. |
| 2005/0242422 A1 * | 11/2005 | Klein ................... H01L 21/563 257/686 |
| 2006/0216868 A1 | 9/2006 | Yang et al. |
| 2006/0244157 A1 | 11/2006 | Carson |
| 2006/0274127 A1 * | 12/2006 | Enomoto ............. B41J 2/14233 347/68 |
| 2007/0108583 A1 | 5/2007 | Shim et al. |
| 2007/0139976 A1 * | 6/2007 | deRochemont .................. 363/17 |
| 2007/0194418 A1 * | 8/2007 | Suminoe ............... H01L 23/057 257/678 |
| 2008/0023830 A1 | 1/2008 | Chang et al. |
| 2008/0111233 A1 | 5/2008 | Pendse |
| 2008/0136035 A1 | 6/2008 | Aggarwal et al. |
| 2008/0296759 A1 | 12/2008 | Ramakrishna et al. |
| 2009/0008765 A1 * | 1/2009 | Yamano et al. ............... 257/690 |
| 2009/0014859 A1 * | 1/2009 | Jeung et al. ................... 257/686 |
| 2009/0170241 A1 | 7/2009 | Shim et al. |
| 2009/0236686 A1 | 9/2009 | Shim et al. |

\* cited by examiner

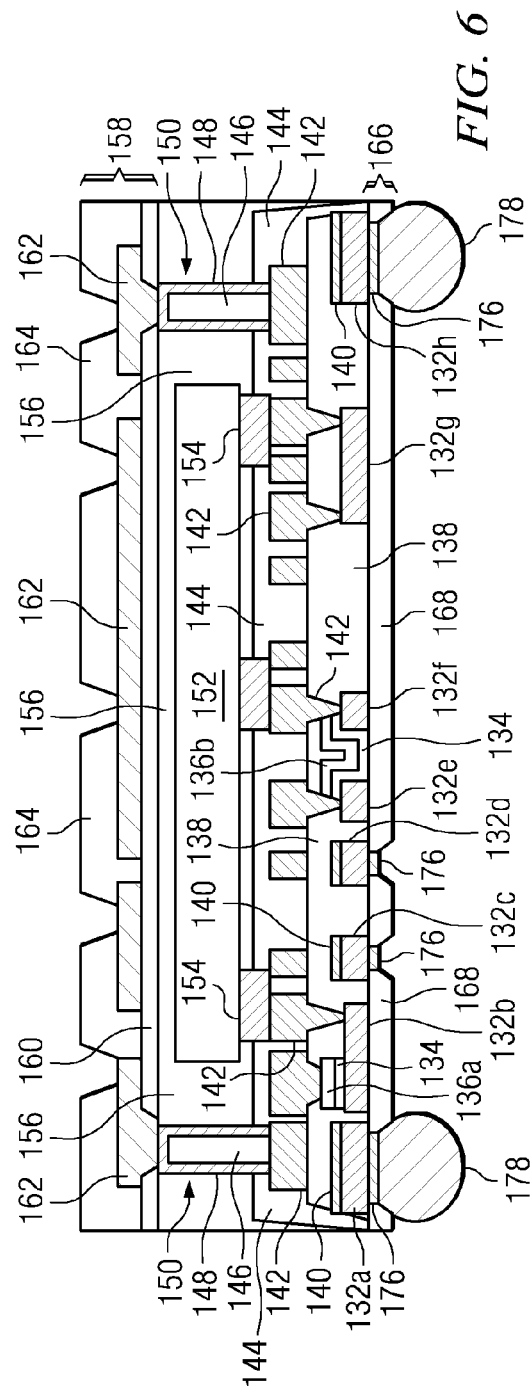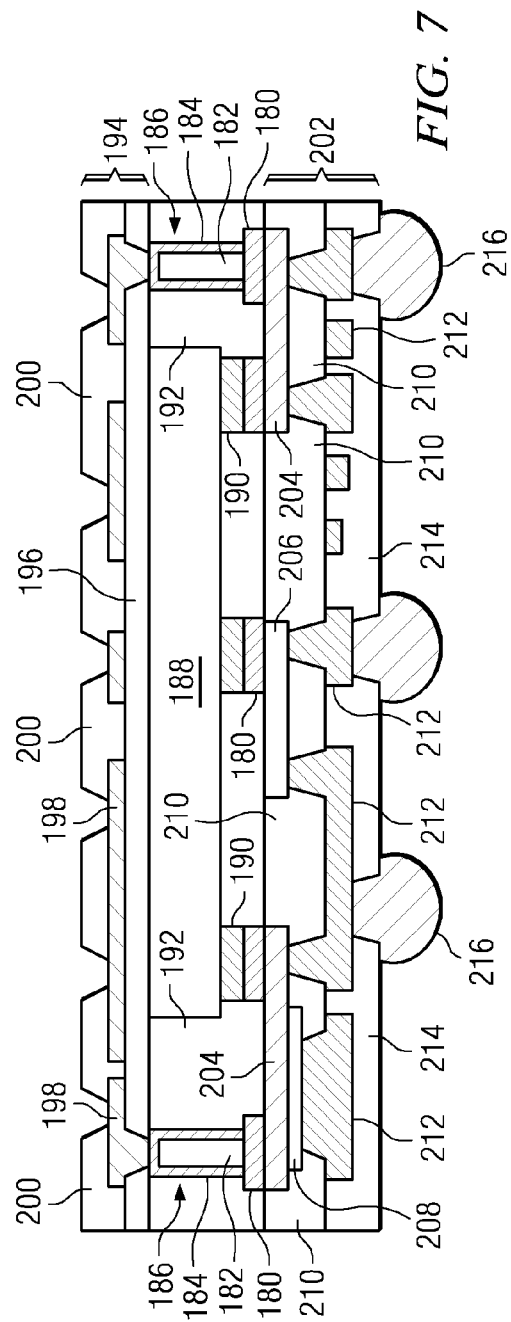

SEMICONDUCTOR DEVICE AND METHOD OF PROVIDING Z-INTERCONNECT CONDUCTIVE PILLARS WITH INNER POLYMER CORE

CLAIM TO DOMESTIC PRIORITY

The present application is a continuation of U.S. patent application Ser. No. 13/405,094, now U.S. Pat. No. 8,742,579, filed Feb. 24, 2012, which is a division of U.S. patent application Ser. No. 12/406,049, now U.S. Pat. No. 8,133,762, filed Mar. 17, 2009, which applications are incorporated herein by reference.

FIELD OF THE INVENTION

The present invention relates in general to semiconductor devices and, more particularly, to a semiconductor device having conductive pillars formed with an inner polymer core for providing z-interconnect in fan-out wafer level chip scale packages.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between a fan-out wafer level chip scale package (FO-WLCSP) containing semiconductor devices on multiple levels (3-D device integration) and external devices can be accomplished with conductive through silicon vias (TSV), through hole vias (THV), or Cu-plated conductive pillars. In most TSVs and THVs, the sidewalls and bottom-side of the via are conformally plated with conductive materials to enhance adhesion. The TSVs and THVs are then filled with another conductive material, for example, by copper deposition through an electroplating process. Voids may be formed within the vias, which causes defects and reduces reliability of the device. TSV and THV can be a slow and costly approach to make vertical electrical interconnections in semiconductor packages. The plated metal pillars are typically very stiff which causes high stress at the interconnect joints, particularly for high aspect ratio interconnects. The high joint stress leads to high contact resistance and potential joint failure.

SUMMARY OF THE INVENTION

A need exists to provide a FO-WLCSP interconnect structure with low-cost interconnects and low stress at the joint interface, while maintaining a high aspect ratio. Accordingly, in one embodiment, the present invention is a method of making a semiconductor device comprising the steps of providing a conductive layer, forming a plurality of conductive z-interconnect structures including an inner stress-relief core over the first conductive layer, and disposing a semiconductor die between the conductive z-interconnect structures.

In another embodiment, the present invention is a method of making a semiconductor device comprising providing a first conductive z-interconnect structure including an inner stress-relief core and disposing a semiconductor die adjacent to the first conductive z-interconnect structure.

In another embodiment, the present invention is a semiconductor device comprising a conductive layer. A plurality of conductive z-interconnect structures including an inner stress-relief core is formed over the conductive layer. A semiconductor die is disposed between the conductive z-interconnect structures.

In another embodiment, the present invention is a semiconductor device comprising a first conductive z-interconnect structure including an inner stress-relief core and a semiconductor die disposed adjacent to the first conductive z-interconnect structure.

BRIEF DESCRIPTION OF THE DRAWINGS

FIG. 6 illustrates the FO-WLCSP with conductive pillars having an inner polymer core and bottom-side IPD formed prior to die attach and encapsulation;

FIG. 7 illustrates the FO-WLCSP with conductive pillars having an inner polymer core and bottom-side IPD formed after to die attach and encapsulation;

DETAILED DESCRIPTION OF THE DRAWINGS

Figure 1:
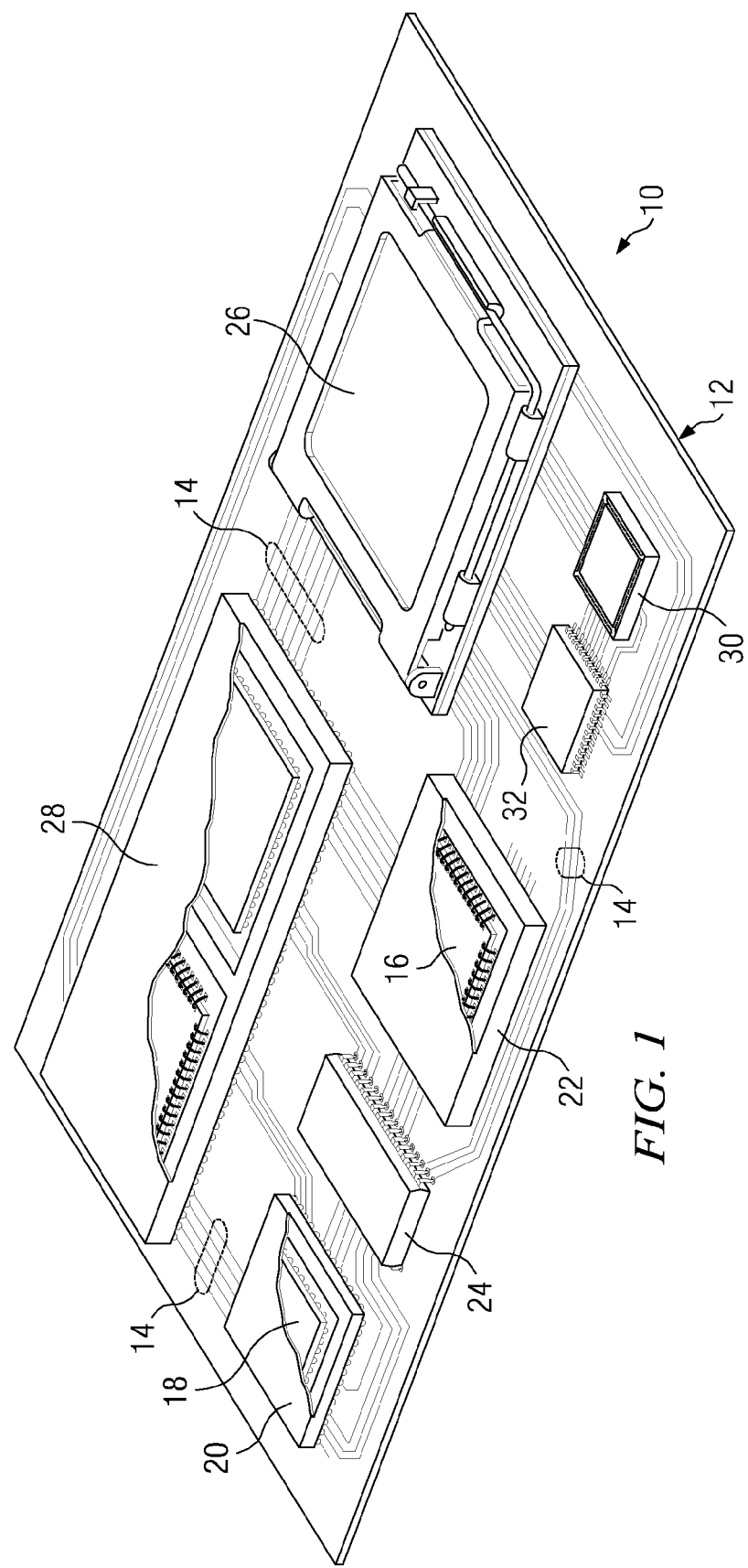
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
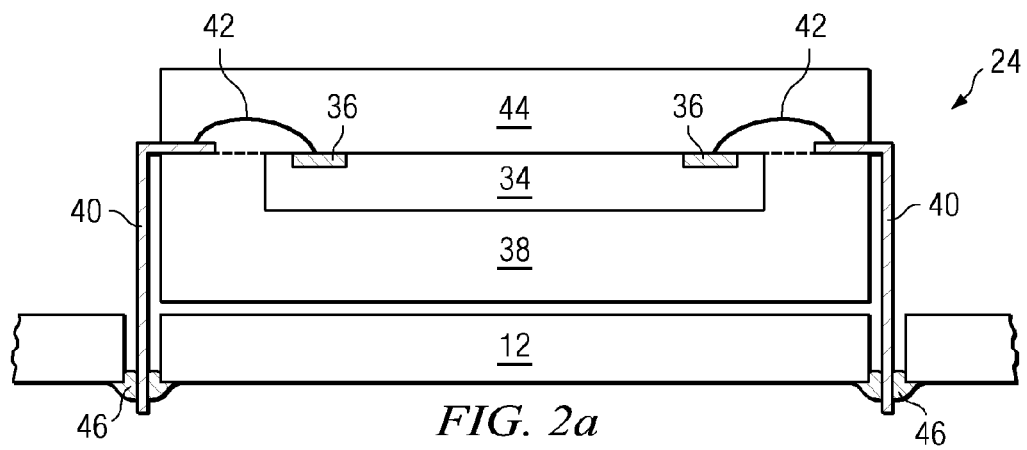
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
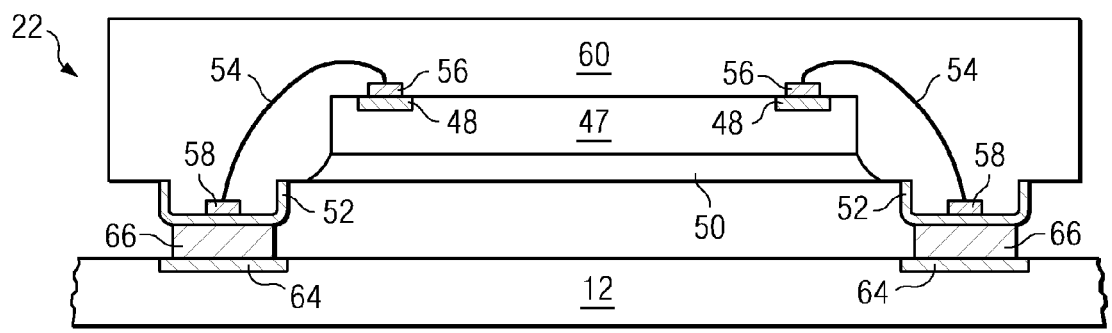

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
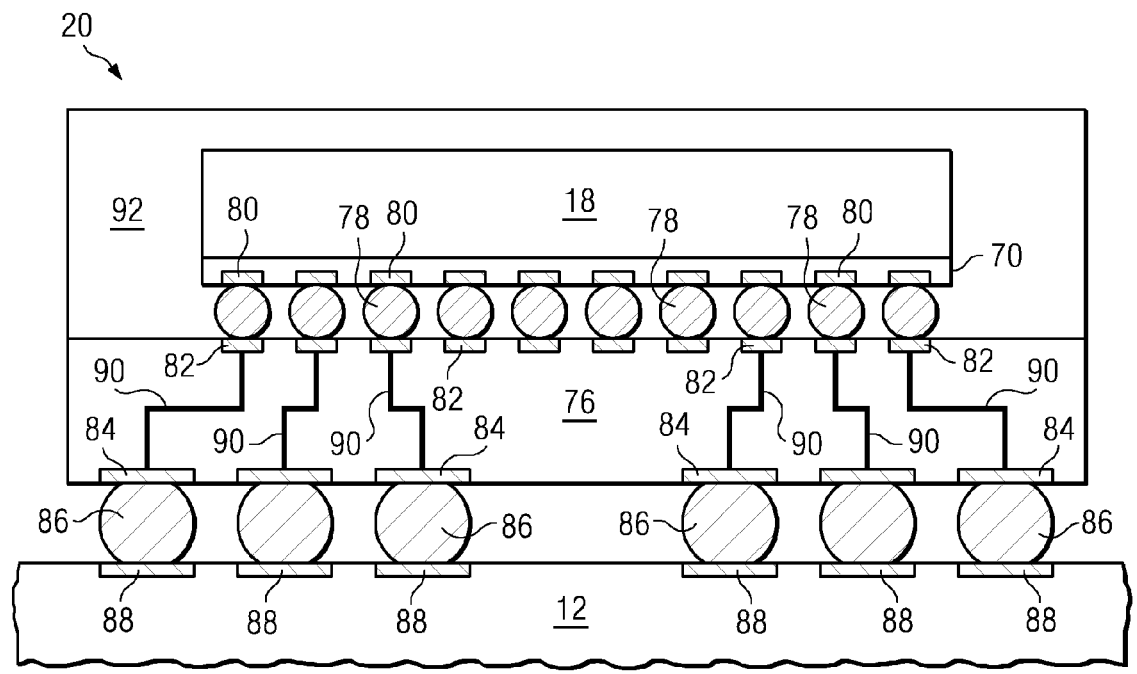

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 3A:
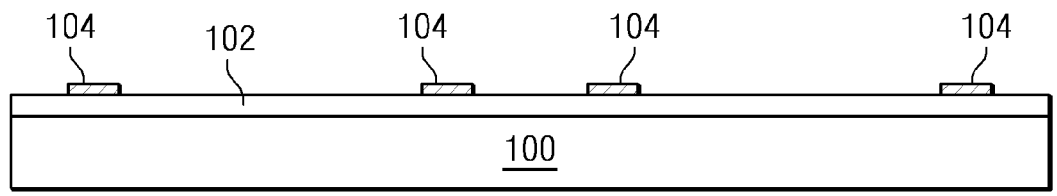
FIGS. 3a-3f illustrate a process of forming a z-interconnect conductive pillar with an inner polymer core.

FIGS. 3a-3f illustrate a process of forming a vertical (z) interconnect structure for a fan-out wafer level chip scale package (FO-WLCSP). In FIG. 3a, a sacrificial wafer-form substrate or carrier 100 contains dummy or sacrificial base material such as silicon (Si), polymer, polymer composite, metal, ceramic, glass, glass epoxy, beryllium oxide, or other suitable low-cost, rigid material or bulk semiconductor material for structural support. A double-sided adhesive layer 102 is applied to substrate 100. Alternatively, an interface layer can be applied to substrate 100.

A conductive layer 104 is formed as contact pads on a topside of adhesive layer 102 using a deposition and patterning process. Conductive layer 104 is formed using PVD, CVD, sputtering, electrolytic plating, electroless plating process, or other suitable metal deposition process. Contact pads 104 can be one or more layers of Al, Cu, Sn, Ni, Au, Ag, or other suitable electrically conductive material. In one embodiment, conductive layer 104 is a solid film for conducting current for later-formed conductive pillars. Conductive layer 104 includes a plated seed layer and under bump metallization (UBM) pads containing multiple layers of selectively plated Ni/Au, Ti/Cu, TiW/Cu, Ti/Cu/NiV/Cu, or their combination. The UBM pads provide bondable pads for bonding with solder bumps, and may further provide a barrier to solder diffusion and seed layer for solder wettability.

Figure 3B:
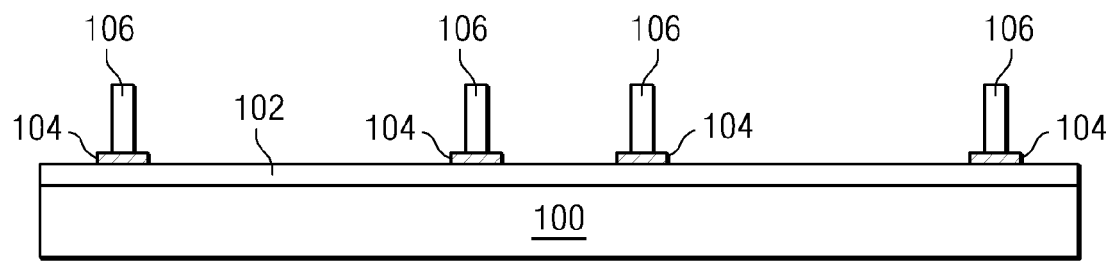

In FIG. 3b, a stress-relief layer is deposited over substrate 100 by spin coating. The stress relief layer is characterized by a high tensile strength capable of enduring significant stress without failure. The stress-relief material typically contains long or cross-linked atomic chains. In one embodiment, the stress-relief layer can be polyimide with high coefficient of thermal expansion (CTE), polynorbornene having low stiffness, or other polymer material. An etching process is used to remove all portions of the polymer layer except over conductive layer 104, leaving polymer posts or pillars 106 for providing stress-relief.

Figure 3C:
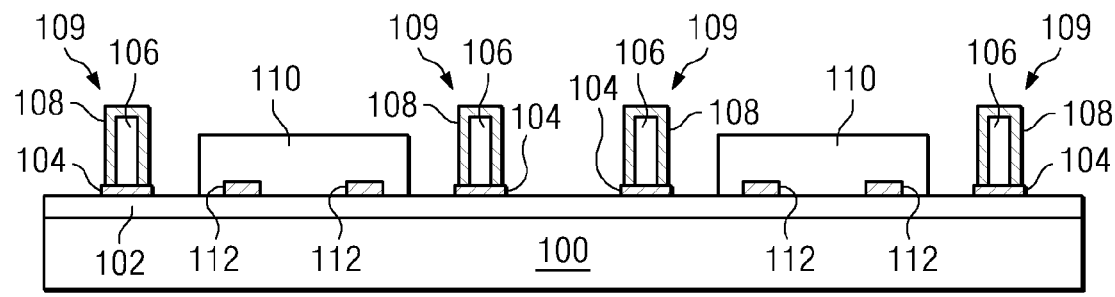

In FIG. 3c, an electrically conductive layer 108 is formed over and around polymer pillars 106 using a deposition and patterning process. Conductive layer 108 is formed using PVD, CVD, sputtering, electrolytic plating, electroless plating process, or other suitable metal deposition process. Conductive layer 108 can be one or more layers of Al, Cu, Sn, Ni, Au, Ag, tungsten (W), or other suitable electrically conductive material. Conductive pads 104 and conductive layer 108 enclose polymer pillars 106 to form z-interconnect conductive pillars 109 having an inner polymer core. The polymer core of conductive pillars 109 reduces junction stress, which is particularly useful for high aspect ratio conductive pillars, e.g., 1.5 aspect ratio based on 4 micrometers (μm) base and 20 μm height with 8 μm pitch.

Semiconductor die 110 are disposed over substrate 100 and between conductive pillars 109 with contact pads 112 oriented toward adhesive layer 102. Semiconductor die 110 each include a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband digital circuits, such as digital signal processor (DSP), memory, or other signal processing circuit. Semiconductor die 110 may also contain integrated passive devices (IPD), such as inductors, capacitors, and resistors, for radio frequency (RF) signal processing. In another embodiment, a discrete component can be mounted over substrate 100 between conductive pillars 109. Semiconductor die 110 can be flipchip-type die or other semiconductor die without bumps. For flipchip-type die, contacts are formed over adhesive layer 102 before bonding.

Figure 3D:
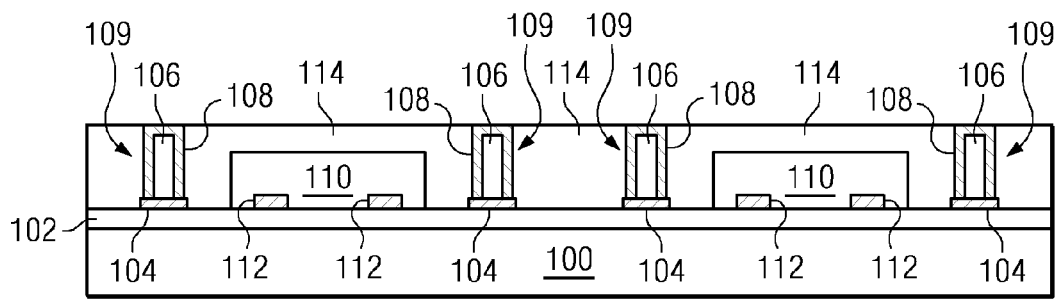

FIG. 3d shows an encapsulant or molding compound 114 deposited over semiconductor die 110, adhesive layer 102, and around conductive pillars 109 using a paste printing, compressive molding, transfer molding, liquid encapsulant molding, vacuum lamination, or other suitable applicator. Encapsulant 114 can be polymer composite material, such as epoxy resin with filler, epoxy acrylate with filler, or polymer with proper filler. Encapsulant 114 is non-conductive and environmentally protects the semiconductor device from external elements and contaminants.

Figure 3E:
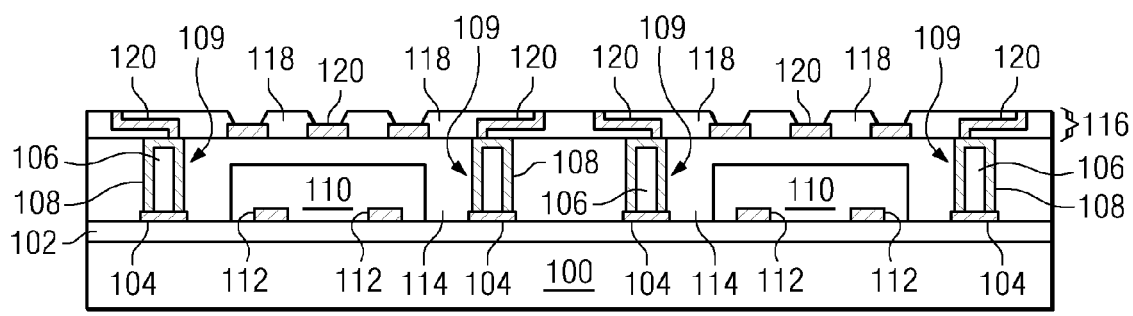

In FIG. 3e, a topside build-up interconnect layer 116 is formed over encapsulant 114. The build-up interconnect layer 116 includes an insulating or passivation layer 118 formed over encapsulant 114. The insulating layer 118 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 118 is deposited using PVD, CVD, printing, spin coating, spray coating, sintering or thermal oxidation.

The topside build-up interconnect layer 116 further includes an electrically conductive layer 120 formed in and around insulating layer 118 using a patterning and deposition process. Conductive layer 120 is formed using PVD, CVD, sputtering, electrolytic plating, electroless plating process, or other suitable metal deposition process. Conductive layer 120 can be one or more layers of Al, Cu, Sn, Ni, Au, Ag, or other suitable electrically conductive material. A portion of insulating layer 118 is removed by an etching process to expose conductive layer 120. One portion of conductive layer 120 electrically connects to conductive pillars 109. Other portions of conductive layer 120 can be electrically common or electrically isolated depending on the design and function of the semiconductor device.

Figure 3F:
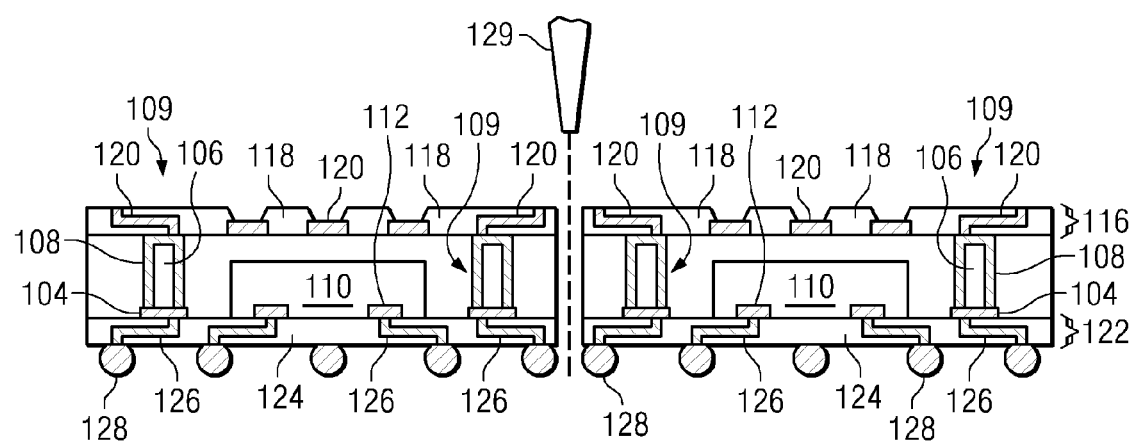

In FIG. 3f, substrate 100 and adhesive layer 102 are removed by chemical etching, mechanical peel-off, CMP, mechanical grinding, thermal bake, laser scanning, or wet stripping. A bottom-side build-up interconnect layer 122 is formed over encapsulant 114. The build-up interconnect layer 122 includes an insulating or passivation layer 124 formed over encapsulant 114. The insulating layer 124 can be one or more layers of SiO2, Si3N4, SiON, Ta2O5, Al2O3, or other material having similar insulating and structural properties. The insulating layer 124 is deposited using PVD, CVD, printing, spin coating, spray coating, sintering or thermal oxidation.

The bottom-side build-up interconnect layer 122 further includes an electrically conductive layer 126 formed in and around insulating layer 124 using a patterning and deposition process. Conductive layer 126 is formed using PVD, CVD, sputtering, electrolytic plating, electroless plating process, or other suitable metal deposition process. Conductive layer 126 can be one or more layers of Al, Cu, Sn, Ni, Au, Ag, or other suitable electrically conductive material. A portion of insulating layer 124 is removed by an etching process to expose conductive layer 126. One portion of conductive layer 126 electrically connects to conductive pillars 109, conductive layer 104, and contact pads 112 of semiconductor die 110. Other portions of conductive layer 126 can be electrically common or electrically isolated depending on the design and function of the semiconductor device.

An electrically conductive solder material is deposited over conductive layer 126 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 128. In some applications, solder bumps 128 are reflowed a second time to improve electrical contact to conductive layer 126. Solder bumps 128 represent one type of interconnect structure that can be formed over conductive layer 126. The interconnect structure can also use bond wires, 3-D interconnects, conductive paste, stud bump, micro bump, or other electrical interconnect.

Figure 4:
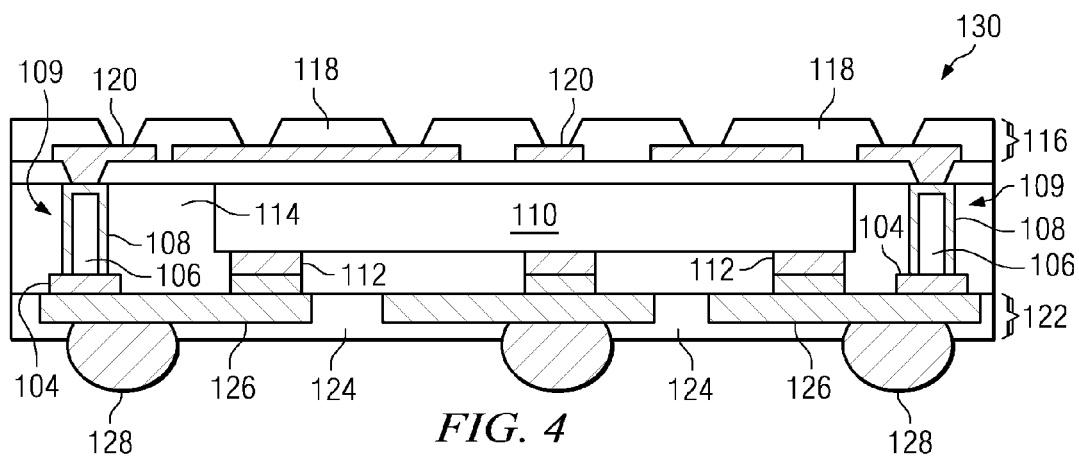
FIG. 4 illustrates the FO-WLCSP with z-interconnect conductive pillars having an inner polymer core.
Figure 5:
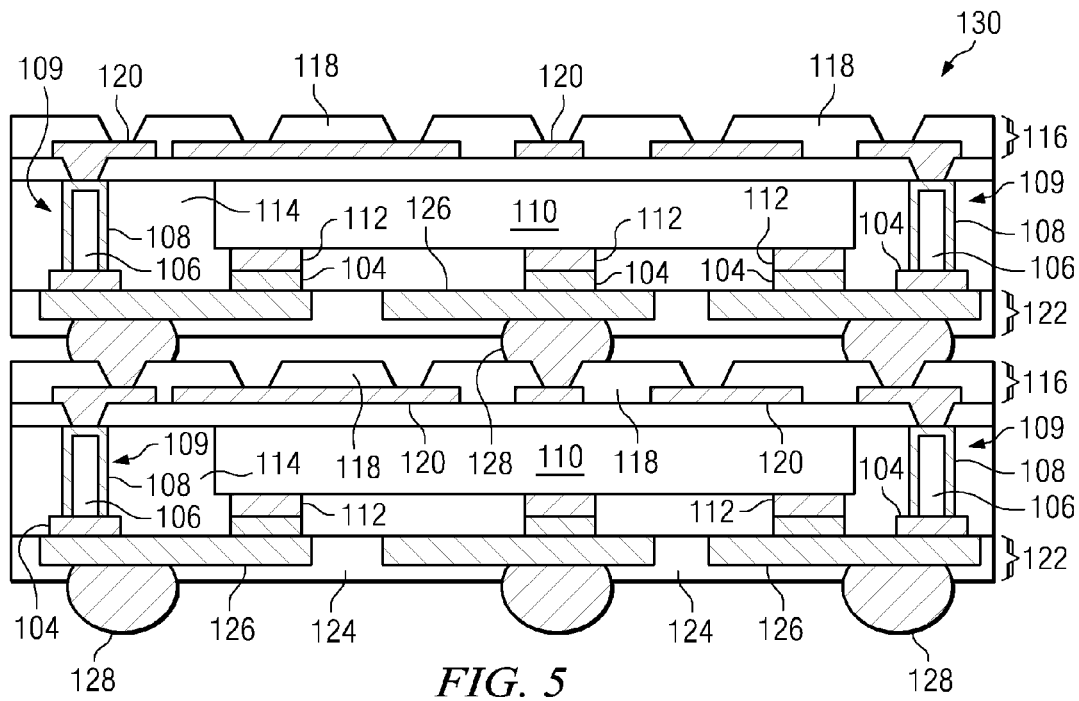
FIG. 5 illustrates stacked FO-WLCSPs electrically connected through conductive pillars having an inner polymer core.

Semiconductor die 110 are singulated with saw blade or laser cutting device 129 into individual semiconductor devices 130 such as shown in FIG. 4. After singulation, the individual semiconductor devices 130 can be stacked, as shown in FIG. 5. Conductive pillars 109 provide z-interconnect between topside interconnect build-up layer 116 and bottom-side interconnect build-up layer 122. Conductive layer 120 electrically connects through conductive pillars 109 to conductive layer 104 and contact pads 112 of semiconductor die 110 of each semiconductor device 130. The inner polymer core 106, surrounded by conductive layer 108, provides both electrical interconnection between build-up layers 116 and 122, as well as stress relief for high profile pillars, using a simple, low-cost manufacturing process. The low-stiffness polymer, e.g., 1 GPa, reduces stress effects of thermal expansion.

FIG. 6 shows an embodiment with a bottom-side integrated passive device (IPD) formed over a substrate, similar to FIG. 3*a*, prior to die attach and molding. An electrically conductive layer 132 is patterned and deposited over the substrate to form individual portions or sections 132*a*-132*h*. The individual portions of conductive layer 132 can be electrically common or electrically isolated depending on the connectivity of the individual semiconductor die. Conductive layer 132 is formed using PVD, CVD, sputtering, electrolytic plating, electroless plating process, or other suitable metal deposition process. Conductive layer 132 can be one or more layers of Al, Cu, Sn, Ni, Au, Ag, or other suitable electrically conductive material.

An insulating layer 134 is formed over conductive layer 132*b* and the substrate between conductive layer 132*e* and 132*f*. The insulating layer 134 can be one or more layers of Si3N4, SiO2, SiON, Ta2O5, ZnO, ZrO2, Al2O3, polyimide, benzocyclobutene (BCB), polybenzoxazoles (PBO), or other suitable dielectric material. The insulating layer 134 is patterned using PVD, CVD, printing, sintering, or thermal oxidation.

A resistive layer 136 is patterned and deposited over insulating layer 134 using PVD or CVD. Resistive layer 136 has individual portions or sections 136*a*-136*b*. Resistive layer 136*a* is deposited over conductive layer 132*b*. Resistive layer 136*b* is deposited over insulating layer 134 between conductive layers 132*e*-132*f*. The individual portions of resistive layer 136 can be electrically connected or electrically isolated depending on the connectivity of the individual semiconductor die. Resistive layer 136 is tantalum silicide (TaxSiy) or other metal silicides, TaN, nickel chromium (NiCr), TiN, or doped poly-silicon having a resistivity between 5 and 100 ohm/sq. Resistive layer 136 and insulating layer 134 can be formed with the same mask and etched at the same time. Alternatively, resistive layer 136 and insulating layer 134 can be patterned and etched with a different mask.

An electrically conductive layer 140 is patterned and deposited over conductive layer 132 to form individual portions or sections for further interconnectivity. The individual portions of conductive layer 140 can be electrically common or electrically isolated depending on the connectivity of the individual semiconductor die. Conductive layer 140 is formed using PVD, CVD, sputtering, electrolytic plating, electroless plating process, or other suitable metal deposition process. Conductive layer 140 can be one or more layers of Al, Cu, Sn, Ni, Au, Ag, or other suitable electrically conductive material.

An insulating or passivation layer 138 is formed over insulating layer 134, resistive layer 136, and conductive layers 132 and 140. The passivation layer 138 can be one or more layers of SiO2, Si3N4, SiON, Ta2O5, Al2O3, or other material having suitable insulating properties. The deposition of passivation layer 138 may involve spin coating, PVD, CVD, printing, sintering, or thermal oxidation. A portion of passivation layer 138 is removed to expose conductive layer 132, insulating layer 134, and resistive layer 136.

An electrically conductive layer 142 is patterned and deposited over conductive layer 132, insulating layer 134, resistive layer 136, and passivation layer 138 to form individual portions or sections which can be electrically common or electrically isolated depending on the connectivity of the individual semiconductor die. Conductive layer 142 is formed using PVD, CVD, sputtering, electrolytic plating, electroless plating process, or other suitable metal deposition process. Conductive layer 142 can be one or more layers of Al, Cu, Sn, Ni, Au, Ag, or other suitable electrically conductive material.

An insulating or passivation layer 144 is formed over conductive layers 142 and insulating layer 138. The passivation layer 144 can be one or more layers of SiO2, Si3N4, SiON, Ta2O5, Al2O3, or other material having suitable insulating properties. The deposition of passivation layer 144 may involve spin coating, PVD, CVD, printing, sintering, or thermal oxidation. A portion of passivation layer 144 is removed to expose conductive layer 142.

The structures described in FIG. 6 constitute one or more passive circuit elements or IPDs. In one embodiment, conductive layer 132b, insulating layer 134, resistive layer 136b, and conductive layer 142 is a metal-insulator-metal (MIM) capacitor. Resistive layer 136b is a resistor element in the passive circuit. Other individual sections of conductive layer 132 and/or conductive layer 142 can be wound or coiled in plan-view to produce or exhibit the desired properties of an inductor. The IPD structure provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

A polymer layer is deposited over passivation layer 144 and conductive layer 142 by spin coating. An etching process is used to remove all portions of the polymer layer except over conductive layer 142, leaving polymer posts or pillars 146, similar to FIG. 3b. An electrically conductive layer 148 is formed over polymer pillars 146 using a deposition and patterning process, similar to FIG. 3c. Conductive layer 148 is formed using PVD, CVD, sputtering, electrolytic plating, electroless plating process, or other suitable metal deposition process. Conductive layer 148 can be one or more layers of Al, Cu, Sn, Ni, Au, Ag, W, or other suitable electrically conductive material. Conductive layers 142 and 148 enclose polymer pillars 146 to form z-interconnect conductive pillars 150 having an inner polymer core. The polymer core of conductive pillars 150 reduces junction stress, which is particularly useful for high aspect ratio conductive pillars needed to provide z-interconnect in semiconductor devices having a high vertical dimension.

Semiconductor die 152 is disposed over the substrate between conductive pillars 150 with contact pads 154 oriented toward conductive layer 142, similar to FIG. 3c. Semiconductor die 152 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband digital circuits, such as DSP, memory, or other signal processing circuit. Semiconductor die 152 may also contain IPD, such as inductors, capacitors, and resistors, for RF signal processing. In another embodiment, a discrete component can be mounted over the substrate between conductive pillars 150.

An encapsulant or molding compound 156 is deposited over semiconductor die 152, passivation layer 144, and around conductive pillars 150 using a paste printing, compressive molding, transfer molding, liquid encapsulant molding, vacuum lamination, or other suitable applicator, similar to FIG. 3d. Encapsulant 156 can be polymer composite material, such as epoxy resin with filler, epoxy acrylate with filler, or polymer with proper filler. Encapsulant 156 is non-conductive and environmentally protects the semiconductor device from external elements and contaminants.

A topside build-up interconnect layer 158 is formed over encapsulant 156 and conductive pillars 150. The build-up interconnect layer 158 includes an insulating or passivation layer 160 formed over encapsulant 156. The insulating layer 160 can be one or more layers of SiO2, Si3N4, SiON, Ta2O5, Al2O3, or other material having similar insulating and structural properties. The insulating layer 160 is deposited using PVD, CVD, printing, spin coating, spray coating, sintering or thermal oxidation. A portion of insulating layer 160 is removed by an etching process to expose conductive pillars 150.

The topside build-up interconnect layer 158 further includes an electrically conductive layer 162 formed over insulating layer 160 and conductive layer 148 using a patterning and deposition process. Conductive layer 162 is formed using PVD, CVD, sputtering, electrolytic plating, electroless plating process, or other suitable metal deposition process. Conductive layer 162 can be one or more layers of Al, Cu, Sn, Ni, Au, Ag, or other suitable electrically conductive material. One portion of conductive layer 162 electrically connects to conductive pillar 150. Other portions of conductive layer 162 can be electrically common or electrically isolated depending on the design and function of the semiconductor device.

The build-up interconnect layer 158 further includes an insulating or passivation layer 164 formed over passivation layer 160 and conductive layer 162. The insulating layer 164 can be one or more layers of SiO2, Si3N4, SiON, Ta2O5, Al2O3, or other material having similar insulating and structural properties. The insulating layer 164 is deposited using PVD, CVD, printing, spin coating, spray coating, sintering or thermal oxidation. A portion of insulating layer 164 is removed by an etching process to expose conductive layer 162.

The substrate and adhesive layers are removed by chemical etching, mechanical peel-off, CMP, mechanical grinding, thermal bake, laser scanning, or wet stripping, similar to FIG. 3f. A bottom-side build-up interconnect layer 166 is formed over conductive layer 132 and passivation layer 138. The build-up interconnect layer 166 includes an insulating or passivation layer 168 formed over conductive layer 132 and passivation layer 138. The insulating layer 168 can be one or more layers of SiO2, Si3N4, SiON, Ta2O5, Al2O3, or other material having similar insulating and structural properties. The insulating layer 168 is deposited using PVD, CVD, printing, spin coating, spray coating, sintering or thermal oxidation.

The bottom-side build-up interconnect layer 166 further includes an electrically conductive layer 176 formed in and around insulating layer 168 using a patterning and deposition process. Conductive layer 176 is formed using PVD, CVD, sputtering, electrolytic plating, electroless plating process, or other suitable metal deposition process. Conductive layer 176 can be one or more layers of Al, Cu, Sn, Ni, Au, Ag, or other suitable electrically conductive material. A portion of insulating layer 168 is removed by an etching process to expose conductive layer 176. One portion of conductive layer 176 electrically connects to conductive layers 132 and 142, conductive pillars 150, and contact pads 154 of semiconductor die 152. Other portions of conductive layer 176 can be electrically common or electrically isolated depending on the design and function of the semiconductor device. Conductive layer 176 includes UBM pads for external interconnect.

An electrically conductive solder material is deposited over conductive layer 176 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 178. In some applications, solder bumps 178 are reflowed a second time to improve electrical contact to conductive layer 176. Solder bumps 178 represent one type of interconnect structure that can be formed over conductive layer 176. The interconnect structure can also use bond wires, 3-D interconnects, conductive paste, stud bump, micro bump, or other electrical interconnect.

The semiconductor package can be stacked and/or mounted to a package substrate that includes pins or contact pads for interconnection with other system components. Conductive pillars 150 provide z-interconnect between topside interconnect build-up layer 158 and bottom-side interconnect build-up layer 166. Conductive layer 162 electrically connects through conductive pillars 150 to conductive layer 142 and contact pads 154 of semiconductor die 152, as well as the IPD structure. The inner polymer core 146, surrounded by conductive layer 148, provides both electrical interconnection between build-up layers 158 and 166, as well as stress relief for high profile pillars, using a simple, low-cost manufacturing process.

FIG. 7 shows an embodiment with a bottom-side IPD formed after to die attach and molding. A double-sided adhesive layer is applied to the sacrificial substrate, similar to FIG. 3a. A conductive layer 180 is formed as contact pads on a topside of the adhesive layer using a deposition and patterning process. Conductive layer 180 is formed using PVD, CVD, sputtering, electrolytic plating, electroless plating process, or other suitable metal deposition process. Contact pads 180 can be one or more layers of Al, Cu, Sn, Ni, Au, Ag, or other suitable electrically conductive material. In one embodiment, conductive layer 180 is a solid film for conducting current for later-formed conductive pillars. Conductive layer 180 includes a plated seed layer and UBM pads containing multiple layers of selectively plated Ni/Au, Ti/Cu, TiW/Cu, Ti/Cu/NiV/Cu, or their combination. The UBM pads provide bondable pads for bonding with solder bumps, and may further provide a barrier to solder diffusion and seed layer for solder wettability.

A polymer layer is deposited over the adhesive layer and conductive layer 180 by spin coating. An etching process is used to remove all portions of the polymer layer except over conductive layer 180, leaving polymer posts or pillars 182, similar to FIG. 3b. An electrically conductive layer 184 is formed over polymer pillars 182 using a deposition and patterning process, similar to FIG. 3c. Conductive layer 184 is formed using PVD, CVD, sputtering, electrolytic plating, electroless plating process, or other suitable metal deposition process. Conductive layer 184 can be one or more layers of Al, Cu, Sn, Ni, Au, Ag, W, or other suitable electrically conductive material. Conductive layers 180 and 184 enclose polymer pillars 182 to form z-interconnect conductive pillars 186 having an inner polymer core. The polymer core of conductive pillars 186 reduces junction stress, which is particularly useful for high aspect ratio conductive pillars needed to provide z-interconnect in semiconductor devices having a high vertical dimension.

Semiconductor die 188 is disposed over the substrate between conductive pillars 186 with contact pads 190 oriented toward conductive layer 180, similar to FIG. 3c. Semiconductor die 188 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband digital circuits, such as DSP, memory, or other signal processing circuit. Semiconductor die 188 may also contain IPD, such as inductors, capacitors, and resistors, for RF signal processing. In another embodiment, a discrete component can be mounted over the substrate between conductive pillars 186.

An encapsulant or molding compound 192 is deposited over semiconductor die 188 and around conductive pillars 186 using a paste printing, compressive molding, transfer molding, liquid encapsulant molding, vacuum lamination, or other suitable applicator, similar to FIG. 3d. Encapsulant 192 can be polymer composite material, such as epoxy resin with filler, epoxy acrylate with filler, or polymer with proper filler. Encapsulant 192 is non-conductive and environmentally protects the semiconductor device from external elements and contaminants.

A topside build-up interconnect layer 194 is formed over encapsulant 192 and conductive pillars 186. The build-up interconnect layer 194 includes an insulating or passivation layer 196 formed over encapsulant 192. The insulating layer 196 can be one or more layers of SiO2, Si3N4, SiON, Ta2O5, Al2O3, or other material having similar insulating and structural properties. The insulating layer 196 is deposited using PVD, CVD, printing, spin coating, spray coating, sintering or thermal oxidation. A portion of insulating layer 196 is removed by an etching process to expose conductive layer 184.

The topside build-up interconnect layer 194 further includes an electrically conductive layer 198 formed over insulating layer 196 using a patterning and deposition process. Conductive layer 198 is formed using PVD, CVD, sputtering, electrolytic plating, electroless plating process, or other suitable metal deposition process. Conductive layer 198 can be one or more layers of Al, Cu, Sn, Ni, Au, Ag, or other suitable electrically conductive material. One portion of conductive layer 198 electrically connects to conductive pillar 186. Other portions of conductive layer 198 can be electrically common or electrically isolated depending on the design and function of the semiconductor device.

The build-up interconnect layer 194 further includes an insulating or passivation layer 200 formed over passivation layer 196 and conductive layer 198. The insulating layer 200 can be one or more layers of SiO2, Si3N4, SiON, Ta2O5, Al2O3, or other material having similar insulating and structural properties. The insulating layer 200 is deposited using PVD, CVD, printing, spin coating, spray coating, sintering or thermal oxidation. A portion of insulating layer 200 is removed by an etching process to expose conductive layer 198.

The substrate and adhesive layer are removed by chemical etching, mechanical peel-off, CMP, mechanical grinding, thermal bake, laser scanning, or wet stripping, similar to FIG. 3f. A bottom-side build-up interconnect layer 202 is formed over conductive layer 180 and encapsulant 192. The build-up interconnect layer 202 includes an electrically conductive layer 204 which is patterned and deposited over the substrate to form individual portions or sections. The individual portions of conductive layer 204 can be electrically common or electrically isolated depending on the connectivity of the individual semiconductor die. Conductive layer 204 is formed using PVD, CVD, sputtering, electrolytic plating, electroless plating process, or other suitable metal deposition process. Conductive layer 204 can be one or more layers of Al, Cu, Sn, Ni, Au, Ag, or other suitable electrically conductive material. Conductive layer 204 electrically connects to conductive layer 180 and conductive pillars 186.

A resistive layer 206 is patterned and deposited over encapsulant 192 using PVD or CVD. Resistive layer 206 is TaxSiy or other metal silicides, TaN, NiCr, TiN, or doped poly-silicon having a resistivity between 5 and 100 ohm/sq. An insulating layer 208 is formed over conductive layer 204. The insulating layer 208 can be one or more layers of Si3N4, SiO2, SiON, Ta2O5, ZnO, ZrO2, Al2O3, polyimide, BCB, PBO, or other suitable dielectric material. The insulating layer 208 is patterned using PVD, CVD, printing, sintering, or thermal oxidation.

An insulating or passivation layer 210 is formed over encapsulant 192, resistive layer 206, insulating layer 208, and conductive layer 204. The passivation layer 210 can be one or more layers of SiO2, Si3N4, SiON, Ta2O5, Al2O3, or other material having suitable insulating properties. The deposition of passivation layer 210 may involve spin coating, PVD, CVD, printing, sintering, or thermal oxidation. A portion of passivation layer 210 is removed to expose conductive layer 204, resistive layer 206, and insulating layer 208.

An electrically conductive layer 212 is patterned and deposited over conductive layer 204, resistive layer 206, and insulating layer 208 to form individual portions or sections for further interconnectivity. The individual portions of conductive layer 212 can be electrically common or electrically isolated depending on the connectivity of the individual semiconductor die. Conductive layer 212 is formed using PVD, CVD, sputtering, electrolytic plating, electroless plating process, or other suitable metal deposition process. Conductive layer 212 can be one or more layers of Al, Cu, Sn, Ni, Au, Ag, or other suitable electrically conductive material.

An insulating or passivation layer 214 is formed over conductive layers 212 and passivation layer 210. The passivation layer 214 can be one or more layers of SiO2, Si3N4, SiON, Ta2O5, Al2O3, or other material having suitable insulating properties. The deposition of passivation layer 214 may involve spin coating, PVD, CVD, printing, sintering, or thermal oxidation. A portion of passivation layer 214 is removed to expose conductive layer 212.

The structures described in FIG. 7 constitute one or more passive circuit elements or IPDs. In one embodiment, conductive layer 204, insulating layer 208, and conductive layer 212 is a MIM capacitor. Resistive layer 206 is a resistor element in the passive circuit. Other individual sections of conductive layer 212 can be wound or coiled in plan-view to produce or exhibit the desired properties of an inductor.

An electrically conductive solder material is deposited over conductive layer 212 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 216. In some applications, solder bumps 216 are reflowed a second time to improve electrical contact to conductive layer 212. Solder bumps 212 represent one type of interconnect structure that can be formed over conductive layer 212. The interconnect structure can also use bond wires, 3-D interconnects, conductive paste, stud bump, micro bump, or other electrical interconnect.

The semiconductor package can be stacked and/or mounted to a package substrate that includes pins or contact pads for interconnection with other system components. Conductive pillars 186 provide z-interconnect between topside interconnect build-up layer 194 and bottom-side interconnect build-up layer 202. Conductive layer 198 electrically connects through conductive pillars 186 to conductive layer 180 and contact pads 190 of semiconductor die 188, as well as the IPD structure. The inner polymer core 182, surrounded by conductive layer 184, provides both electrical interconnection between build-up layers 194 and 202, as well as stress relief for high profile pillars, using a simple, low-cost manufacturing process.

Figure 8:
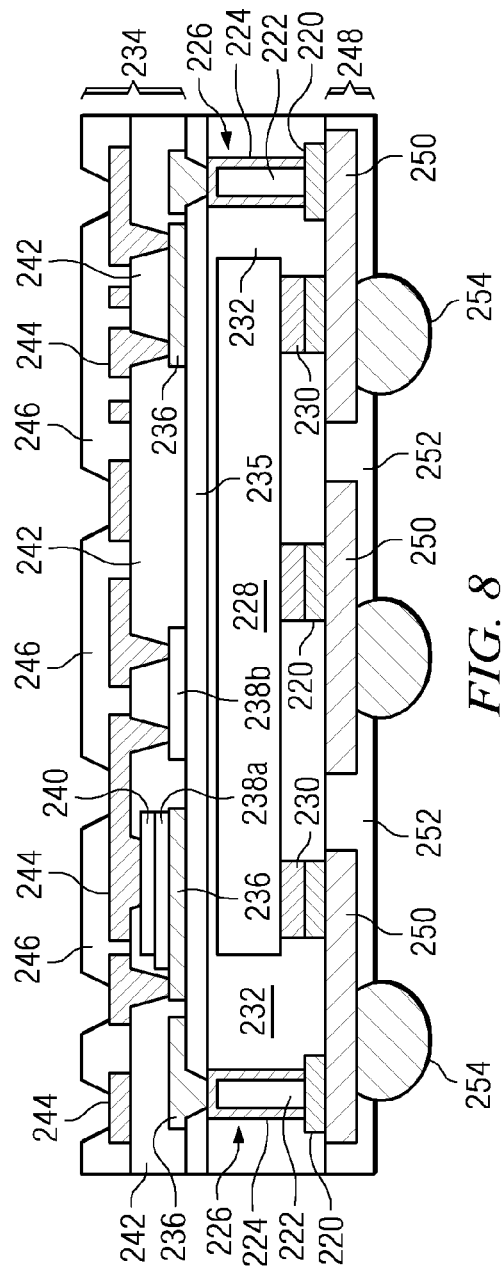
FIG. 8 illustrates the FO-WLCSP with conductive pillars having an inner polymer core and topside IPD.

FIG. 8 shows an embodiment with a topside IPD formed after to die attach and molding. A double-sided adhesive layer is applied to the sacrificial substrate, similar to FIG. 3a. A conductive layer 220 is formed as contact pads on a topside of the adhesive layer using a deposition and patterning process. Conductive layer 220 is formed using PVD, CVD, sputtering, electrolytic plating, electroless plating process, or other suitable metal deposition process. Contact pads 220 can be one or more layers of Al, Cu, Sn, Ni, Au, Ag, or other suitable electrically conductive material. In one embodiment, conductive layer 220 is a solid film for conducting current for later-formed conductive pillars. Conductive layer 220 includes a plated seed layer and UBM pads containing multiple layers of selectively plated Ni/Au, Ti/Cu, TiW/Cu, Ti/Cu/NiV/Cu, or their combination. The UBM pads provide bondable pads for bonding with solder bumps, and may further provide a barrier to solder diffusion and seed layer for solder wettability.

A polymer layer is deposited over the adhesive layer and conductive layer 220 by spin coating. An etching process is used to remove all portions of the polymer layer except over conductive layer 220, leaving polymer posts or pillars 222, similar to FIG. 3b. An electrically conductive layer 224 is formed over polymer pillars 222 using a deposition and patterning process, similar to FIG. 3c. Conductive layer 224 is formed using PVD, CVD, sputtering, electrolytic plating, electroless plating process, or other suitable metal deposition process. Conductive layer 224 can be one or more layers of Al, Cu, Sn, Ni, Au, Ag, W, or other suitable electrically conductive material. Conductive layers 220 and 224 enclose polymer pillars 222 to form z-interconnect conductive pillars 226 having an inner polymer core. The polymer core of conductive pillars 226 reduces junction stress, which is particularly useful for high aspect ratio conductive pillars needed to provide z-interconnect in semiconductor devices having a high vertical dimension.

Semiconductor die 228 is disposed over the substrate between conductive pillars 226 with contact pads 230 oriented toward conductive layer 220, similar to FIG. 3c. Semiconductor die 228 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband digital circuits, such as DSP, memory, or other signal processing circuit. Semiconductor die 228 may also contain IPD, such as inductors, capacitors, and resistors, for RF signal processing. In another embodiment, a discrete component can be mounted over the substrate between conductive pillars 226.

An encapsulant or molding compound 232 is deposited over semiconductor die 228 and around conductive pillars 226 using a paste printing, compressive molding, transfer molding, liquid encapsulant molding, vacuum lamination, or other suitable applicator, similar to FIG. 3d. Encapsulant 232 can be polymer composite material, such as epoxy resin with filler, epoxy acrylate with filler, or polymer with proper filler. Encapsulant 232 is non-conductive and environmentally protects the semiconductor device from external elements and contaminants.

A topside build-up interconnect layer 234 is formed over encapsulant 192. The build-up interconnect layer 234 includes an insulating or passivation layer 235 formed over encapsulant 232 and conductive pillar 226. The passivation layer 235 can be one or more layers of SiO2, Si3N4, SiON, Ta2O5, Al2O3, or other material having suitable insulating properties. The deposition of passivation layer 235 may involve spin coating, PVD, CVD, printing, sintering, or thermal oxidation. A portion of passivation layer 235 is removed to expose conductive pillar 226.

An electrically conductive layer 236 is patterned and deposited over the substrate to form individual portions or sections. The individual portions of conductive layer 236 can be electrically common or electrically isolated depending on the connectivity of the individual semiconductor die. Conductive layer 236 is formed using PVD, CVD, sputtering, electrolytic plating, electroless plating process, or other suitable metal deposition process. Conductive layer 236 can be one or more layers of Al, Cu, Sn, Ni, Au, Ag, or other suitable electrically conductive material. Conductive layer 236 electrically connects to conductive pillars 226.

A resistive layer 238 is patterned and deposited over conductive layer 236 and insulating layer 235 using PVD or CVD. Resistive layer 238 has individual portions or sections 238a-238b. Resistive layer 238a is deposited over conductive layer 236. Resistive layer 238b is deposited over insulating layer 235. The individual portions of resistive layer 238 can be electrically connected or electrically isolated depending on the connectivity of the individual semiconductor die. Resistive layer 238 is TaxSiy or other metal silicides, TaN, NiCr, TiN, or doped poly-silicon having a resistivity between 5 and 100 ohm/sq. An insulating layer 240 is formed over resistive layer 238a. The insulating layer 240 can be one or more layers of Si3N4, SiO2, SiON, Ta2O5, ZnO, ZrO2, Al2O3, polyimide, BCB, PBO, or other suitable dielectric material. The insulating layer 240 is patterned using PVD, CVD, printing, sintering, or thermal oxidation.

An insulating or passivation layer 242 is formed over passivation layer 235 and conductive layer 236, resistive layer 238, and insulating layer 240. The passivation layer 242 can be one or more layers of SiO2, Si3N4, SiON, Ta2O5, Al2O3, or other material having suitable insulating properties. The deposition of passivation layer 242 may involve spin coating, PVD, CVD, printing, sintering, or thermal oxidation. A portion of passivation layer 242 is removed to expose conductive layer 236, resistive layer 238, and insulating layer 240.

An electrically conductive layer 244 is patterned and deposited over passivation layer 242, conductive layer 236, and resistive layer 238 to form individual portions or sections for further interconnectivity. The individual portions of conductive layer 244 can be electrically common or electrically isolated depending on the connectivity of the individual semiconductor die. Conductive layer 244 is formed using PVD, CVD, sputtering, electrolytic plating, electroless plating process, or other suitable metal deposition process. Conductive layer 244 can be one or more layers of Al, Cu, Sn, Ni, Au, Ag, or other suitable electrically conductive material.

An insulating or passivation layer 246 is formed over conductive layers 244 and passivation layer 242. The passivation layer 246 can be one or more layers of SiO2, Si3N4, SiON, Ta2O5, Al2O3, or other material having suitable insulating properties. The deposition of passivation layer 246 may involve spin coating, PVD, CVD, printing, sintering, or thermal oxidation. A portion of passivation layer 246 is removed to expose conductive layer 244.

The structures described in FIG. 8 constitute one or more passive circuit elements or IPDs. In one embodiment, conductive layer 236, resistive layer 238a, insulating layer 240, and conductive layer 244 is a MIM capacitor. Resistive layer 238b is a resistor element in the passive circuit. Other individual sections of conductive layer 244 can be wound or coiled in plan-view to produce or exhibit the desired properties of an inductor.

The substrate and adhesive layer are removed by chemical etching, mechanical peel-off, CMP, mechanical grinding, thermal bake, laser scanning, or wet stripping, similar to FIG. 3f. A bottom-side build-up interconnect layer 248 is formed over conductive layer 220 and encapsulant 232. The build-up interconnect layer 248 includes an electrically conductive layer 250 which is patterned and deposited over the substrate to form individual portions or sections. The individual portions of conductive layer 250 can be electrically common or electrically isolated depending on the connectivity of the individual semiconductor die. Conductive layer 250 is formed using PVD, CVD, sputtering, electrolytic plating, electroless plating process, or other suitable metal deposition process. Conductive layer 250 can be one or more layers of Al, Cu, Sn, Ni, Au, Ag, or other suitable electrically conductive material. Conductive layer 250 electrically connects to conductive layer 220 and conductive pillars 226.

An insulating or passivation layer 252 formed over encapsulant 232 and conductive layer 250. The insulating layer 252 can be one or more layers of SiO2, Si3N4, SiON, Ta2O5, Al2O3, or other material having similar insulating and structural properties. The insulating layer 252 is deposited using PVD, CVD, printing, spin coating, spray coating, sintering or thermal oxidation. A portion of insulating layer 252 is removed by an etching process to expose conductive layer 250.

An electrically conductive solder material is deposited over conductive layer 250 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 254. In some applications, solder bumps 254 are reflowed a second time to improve electrical contact to conductive layer 250. Solder bumps 254 represent one type of interconnect structure that can be formed over conductive layer 250. The interconnect structure can also use bond wires, 3-D interconnects, conductive paste, stud bump, micro bump, or other electrical interconnect.

The semiconductor package can be stacked and/or mounted to a package substrate that includes pins or contact pads for interconnection with other system components. Conductive pillars 226 provide z-interconnect between topside interconnect build-up layer 234 and bottom-side interconnect build-up layer 248. Conductive layer 236 and the IPD structure electrically connect through conductive pillars 226 to conductive layer 250 and contact pads 230 of semiconductor die 228. The inner polymer core 222, surrounded by conductive layer 224, provides both electrical interconnection between build-up layers 234 and 248, as well as stress relief for high profile pillars, using a simple, low-cost manufacturing process.

Figure 9:
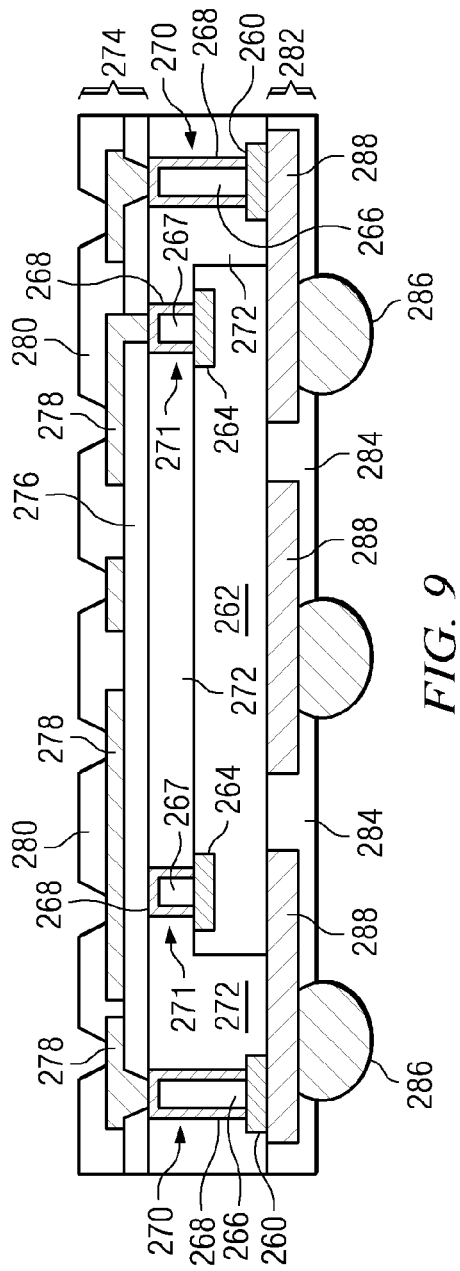
FIG. 9 illustrates the FO-WLCSP with conductive pillars having an inner polymer core formed over contact pads of die.

In FIG. 9, a double-sided adhesive layer is applied to the sacrificial substrate, similar to FIG. 3a. A conductive layer 260 is formed as contact pads on a topside of the adhesive layer using a deposition and patterning process. Conductive layer 260 is formed using PVD, CVD, sputtering, electrolytic plating, electroless plating process, or other suitable metal deposition process. Contact pads 260 can be one or more layers of Al, Cu, Sn, Ni, Au, Ag, or other suitable electrically conductive material. In one embodiment, conductive layer 260 is a solid film for conducting current for later-formed conductive pillars. Conductive layer 260 includes a plated seed layer and UBM pads containing multiple layers of selectively plated Ni/Au, Ti/Cu, TiW/Cu, Ti/Cu/NiV/Cu, or their combination. The UBM pads provide bondable pads for bonding with solder bumps, and may further provide a barrier to solder diffusion and seed layer for solder wettability.

Semiconductor die 262 is disposed over the substrate with contact pads 264 oriented face-up, i.e., away from conductive layer 260. Semiconductor die 262 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband digital circuits, such as DSP, memory, or other signal processing circuit. Semiconductor die 262 may also contain IPD, such as inductors, capacitors, and resistors, for RF signal processing.

A polymer layer is deposited over the adhesive layer, semiconductor die 262, and conductive layer 260 by spin coating. An etching process is used to remove all portions of the polymer layer except over conductive layer 260 and contact pads 264, leaving polymer posts or pillars 266 and 267, similar to FIG. 3b. An electrically conductive layer 268 is formed over polymer pillars 266 and 267 using a deposition and patterning process, similar to FIG. 3c. Conductive layer 268 is formed using PVD, CVD, sputtering, electrolytic plating, electroless plating process, or other suitable metal deposition process. Conductive layer 268 can be one or more layers of Al, Cu, Sn, Ni, Au, Ag, W, or other suitable electrically conductive material. Conductive layers 260 and 268 enclose polymer pillars 266 to form z-interconnect conductive pillars 270 having an inner polymer core. Contact pads 264 and conductive layer 268 enclose polymer pillars 267 to form z-interconnect conductive pillars 271 having an inner polymer core. The polymer core of conductive pillars 270 and 271 reduces junction stress, which is particularly useful for high aspect ratio conductive pillars needed to provide z-interconnect in semiconductor devices having a high vertical dimension.

An encapsulant or molding compound 272 is deposited over semiconductor die 262 and around conductive pillars 270-271 using a paste printing, compressive molding, transfer molding, liquid encapsulant molding, vacuum lamination, or other suitable applicator, similar to FIG. 3d. Encapsulant 272 can be polymer composite material, such as epoxy resin with filler, epoxy acrylate with filler, or polymer with proper filler. Encapsulant 272 is non-conductive and environmentally protects the semiconductor device from external elements and contaminants.

A topside build-up interconnect layer 274 is formed over encapsulant 272. The build-up interconnect layer 274 includes an insulating or passivation layer 276 formed over encapsulant 272. The insulating layer 276 can be one or more layers of $SiO_2$, $Si_3N_4$, SiON, $Ta_2O_5$, $Al_2O_3$, or other material having similar insulating and structural properties. The insulating layer 276 is deposited using PVD, CVD, printing, spin coating, spray coating, sintering or thermal oxidation. A portion of insulating layer 276 is removed by an etching process to expose conductive pillars 270-271.

The topside build-up interconnect layer 274 further includes an electrically conductive layer 278 formed over insulating layer 276 using a patterning and deposition process. Conductive layer 278 is formed using PVD, CVD, sputtering, electrolytic plating, electroless plating process, or other suitable metal deposition process. Conductive layer 278 can be one or more layers of Al, Cu, Sn, Ni, Au, Ag, or other suitable electrically conductive material. One portion of conductive layer 278 electrically connects to conductive pillars 270-271. Other portions of conductive layer 278 can be electrically common or electrically isolated depending on the design and function of the semiconductor device.

The build-up interconnect layer 274 further includes an insulating or passivation layer 280 formed over passivation layer 276 and conductive layer 278. The insulating layer 280 can be one or more layers of $SiO_2$, $Si_3N_4$, SiON, $Ta_2O_5$, $Al_2O_3$, or other material having similar insulating and structural properties. The insulating layer 280 is deposited using PVD, CVD, printing, spin coating, spray coating, sintering or thermal oxidation. A portion of insulating layer 280 is removed by an etching process to expose conductive layer 278.

The substrate and adhesive layer are removed by chemical etching, mechanical peel-off, CMP, mechanical grinding, thermal bake, laser scanning, or wet stripping, similar to FIG. 3f. A bottom-side build-up interconnect layer 282 is formed over conductive layer 260, encapsulant 272, and semiconductor die 262. The build-up interconnect layer 282 includes an electrically conductive layer 288 formed over encapsulant 272 using a patterning and deposition process. Conductive layer 288 is formed using PVD, CVD, sputtering, electrolytic plating, electroless plating process, or other suitable metal deposition process. Conductive layer 288 can be one or more layers of Al, Cu, Sn, Ni, Au, Ag, or other suitable electrically conductive material. One portion of conductive layer 288 electrically connects to conductive layer 260 and conductive pillars 270. Other portions of conductive layer 288 can be electrically common or electrically isolated depending on the design and function of the semiconductor device.

An insulating or passivation layer 284 is formed over encapsulant 272 and conductive layer 288. The insulating layer 284 can be one or more layers of $SiO_2$, $Si_3N_4$, SiON, $Ta_2O_5$, $Al_2O_3$, or other material having similar insulating and structural properties. The insulating layer 284 is deposited using PVD, CVD, printing, spin coating, spray coating, sintering or thermal oxidation. A portion of insulating layer 284 is removed by an etching process to expose conductive layer 288.

An electrically conductive solder material is deposited over conductive layer 288 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 286. In some applications, solder bumps 286 are reflowed a second time to improve electrical contact to conductive layer 288. Solder bumps 286 represent one type of interconnect structure that can be formed over conductive layer 288. The interconnect structure can also use bond wires, 3-D interconnects, conductive paste, stud bump, micro bump, or other electrical interconnect.

The semiconductor package can be stacked and/or mounted to a package substrate that includes pins or contact pads for interconnection with other system components. Conductive pillars 270 provide z-interconnect between topside interconnect build-up layer 274 and bottom-side interconnect build-up layer 282. Conductive pillars 271 provide z-interconnect between topside interconnect build-up layer 274 and contact pads 264 of semiconductor die 262. Conductive layer 278 and contact pads 264 of semiconductor die 262 electrically connect through conductive pillars 270-271 to conductive layer 288. The inner polymer cores 266-267, surrounded by conductive layer 268, provides both electrical interconnection between build-up layers 274 and 282, as well as stress relief for high profile pillars, using a simple, low-cost manufacturing process.

Figure 10:
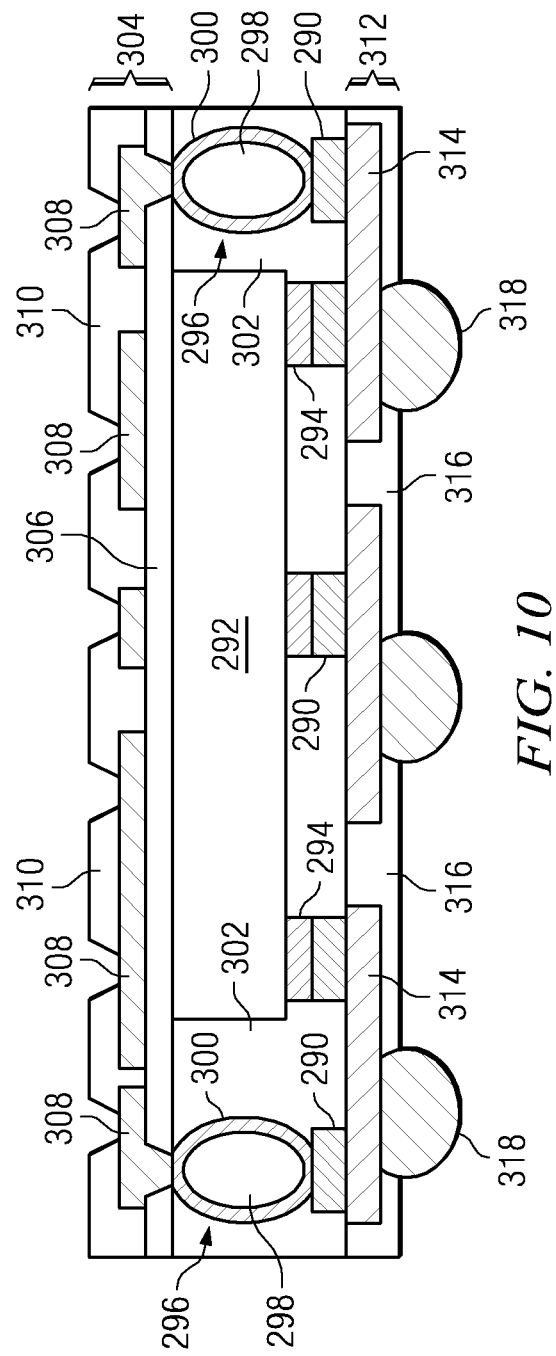
FIG. 10 illustrates the FO-WLCSP with z-interconnect conductive-coated polymer balls.

In FIG. 10, a double-sided adhesive layer is applied to the sacrificial substrate, similar to FIG. 3a. A conductive layer 290 is formed as contact pads on a topside of the adhesive layer using a deposition and patterning process. Conductive layer 290 is formed using PVD, CVD, sputtering, electrolytic plating, electroless plating process, or other suitable metal deposition process. Contact pads 290 can be one or more layers of Al, Cu, Sn, Ni, Au, Ag, or other suitable electrically conductive material. In one embodiment, conductive layer 290 is a solid film for conducting current for later-formed conductive pillars. Conductive layer 290 includes a plated seed layer and UBM pads containing multiple layers of selectively plated Ni/Au, Ti/Cu, TiW/Cu, Ti/Cu/NiV/Cu, or their combination. The UBM pads provide bondable pads for bonding with solder bumps, and may further provide a barrier to solder diffusion and seed layer for solder wettability.

Semiconductor die 292 is disposed over the substrate with contact pads 294 oriented toward and electrically contacting conductive layer 290, similar to FIG. 3c. Semiconductor die 292 includes a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement baseband digital circuits, such as DSP, memory, or other signal processing circuit. Semiconductor die 292 may also contain IPD, such as inductors, capacitors, and resistors, for RF signal processing.

In applications requiring a wider pitch, a metal-coated polymer ball 296 is formed over conductive layer 290. The metal-coated polymer ball 296 includes an inner polymer core ball 298 and outer conductive layer 300. The polymer core reduces junction stress, which is particularly useful for high aspect ratio conductive pillars needed to provide z-interconnect in semiconductor devices having a high vertical dimension.

An encapsulant or molding compound 302 is deposited over semiconductor die 292 and around metal-coated polymer balls 296 using a paste printing, compressive molding, transfer molding, liquid encapsulant molding, vacuum lamination, or other suitable applicator, similar to FIG. 3d. Encapsulant 302 can be polymer composite material, such as epoxy resin with filler, epoxy acrylate with filler, or polymer with proper filler. Encapsulant 302 is non-conductive and environmentally protects the semiconductor device from external elements and contaminants.

A topside build-up interconnect layer 304 is formed over encapsulant 302 and semiconductor die 292. The build-up interconnect layer 304 includes an insulating or passivation layer 306 formed over encapsulant 302 and semiconductor die 292. The insulating layer 306 can be one or more layers of SiO2, Si3N4, SiON, Ta2O5, Al2O3, or other material having similar insulating and structural properties. The insulating layer 306 is deposited using PVD, CVD, printing, spin coating, spray coating, sintering or thermal oxidation. A portion of insulating layer 306 is removed by an etching process to expose metal-coated polymer balls 296.

The topside build-up interconnect layer 304 further includes an electrically conductive layer 308 formed over insulating layer 306 using a patterning and deposition process. Conductive layer 308 is formed using PVD, CVD, sputtering, electrolytic plating, electroless plating process, or other suitable metal deposition process. Conductive layer 308 can be one or more layers of Al, Cu, Sn, Ni, Au, Ag, or other suitable electrically conductive material. One portion of conductive layer 308 electrically connects to metal-coated polymer balls 296. Other portions of conductive layer 308 can be electrically common or electrically isolated depending on the design and function of the semiconductor device.

The build-up interconnect layer 304 further includes an insulating or passivation layer 310 formed over insulating layer 306 and conductive layer 308. The insulating layer 310 can be one or more layers of SiO2, Si3N4, SiON, Ta2O5, Al2O3, or other material having similar insulating and structural properties. The insulating layer 310 is deposited using PVD, CVD, printing, spin coating, spray coating, sintering or thermal oxidation. A portion of insulating layer 310 is removed by an etching process to expose conductive layer 308.

The substrate and adhesive layers are removed by chemical etching, mechanical peel-off, CMP, mechanical grinding, thermal bake, laser scanning, or wet stripping, similar to FIG. 3f. A bottom-side build-up interconnect layer 312 is formed over conductive layer 290 and encapsulant 302. The build-up interconnect layer 312 includes an electrically conductive layer 314 formed over encapsulant 302 using a patterning and deposition process. Conductive layer 314 is formed using PVD, CVD, sputtering, electrolytic plating, electroless plating process, or other suitable metal deposition process. Conductive layer 314 can be one or more layers of Al, Cu, Sn, Ni, Au, Ag, or other suitable electrically conductive material. The portions conductive layer 314 can be electrically common or electrically isolated depending on the design and function of the semiconductor device.

An insulating or passivation layer 316 is formed over encapsulant 302 and conductive layer 314. The insulating layer 316 can be one or more layers of SiO2, Si3N4, SiON, Ta2O5, Al2O3, or other material having similar insulating and structural properties. The insulating layer 316 is deposited using PVD, CVD, printing, spin coating, spray coating, sintering or thermal oxidation. A portion of insulating layer 316 is removed by an etching process to expose conductive layer 314.

An electrically conductive solder material is deposited over conductive layer 314 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 318. In some applications, solder bumps 318 are reflowed a second time to improve electrical contact to conductive layer 314. Solder bumps 318 represent one type of interconnect structure that can be formed over conductive layer 314. The interconnect structure can also use bond wires, 3-D interconnects, conductive paste, stud bump, micro bump, or other electrical interconnect.

The semiconductor package can be stacked and/or mounted to a package substrate that includes pins or contact pads for interconnection with other system components. The metal-coated polymer balls 296 provide z-interconnect between topside interconnect build-up layer 304 and bottom-side interconnect build-up layer 312. Conductive layer 308 electrically connects through metal-coated polymer balls 296 to conductive layer 314 and contact pads 294 of semiconductor die 292. The inner polymer core 298, surrounded by conductive layer 300, provides both electrical interconnection between build-up layers 304 and 312, as well as stress relief for high profile pillars, using a simple, low-cost manufacturing process.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first conductive layer;
   forming a plurality of polymer pillars over the first conductive layer;
   forming a second conductive layer over the polymer pillars to form a plurality of conductive z-interconnect structures; and
   disposing a semiconductor die between the conductive z-interconnect structures and contacting the first conductive layer.

2. The method of claim 1, further including forming a first interconnect structure over the conductive z-interconnect structures.

3. The method of claim 2, further including forming a second interconnect structure over the conductive z-interconnect structures opposite the first interconnect structure.

4. The method of claim 1, further including:
   depositing an encapsulant around the conductive z-interconnect structures; and
   forming a build-up interconnect layer over a surface of the encapsulant and electrically connected to the conductive z-interconnect structures.

5. The method of claim 4, further including forming an integrated passive device in the build-up interconnect layer.

6. The method of claim 5, further including configuring the integrated passive device to operate as a capacitor, resistor, or inductor.

7. A method of making a semiconductor device, comprising:
   providing a conductive layer;
   forming a first conductive z-interconnect structure and second conductive z-interconnect structure each in contact with the conductive layer and including an inner polymer core within the first conductive z-interconnect structure and second conductive z-interconnect structure; and
   disposing a semiconductor die between the first conductive z-interconnect structure and second conductive z-interconnect structure and contacting the conductive layer.

8. The method of claim 7, further including forming the inner polymer core in a prolate spheroid shape.

9. The method of claim 7, further including:
   depositing an encapsulant around the first conductive z-interconnect structure and second conductive z-interconnect structure; and
   forming a build-up interconnect layer over a surface of the encapsulant and electrically connected to the first conductive z-interconnect structure and second conductive z-interconnect structure.

10. The method of claim 9, further including forming an integrated passive device in the build-up interconnect layer.

11. The method of claim 10, further including configuring the integrated passive device to operate as a capacitor, resistor, or inductor.

12. A semiconductor device, comprising:
    a conductive layer;
    a plurality of conductive z-interconnect structures including an inner polymer core formed over the conductive layer; and
    a semiconductor die disposed between the conductive z-interconnect structures and contacting the conductive layer.

13. The semiconductor device of claim 12, wherein the inner polymer core includes a prolate spheroid shape.

14. The semiconductor device of claim 12, further including:
    an encapsulant deposited around the conductive z-interconnect structures; and
    a build-up interconnect layer formed over a surface of the encapsulant and electrically connected to the conductive z-interconnect structures.

15. The semiconductor device of claim 14, further including an integrated passive device formed in the build-up interconnect layer.

16. The semiconductor device of claim 15, wherein the integrated passive device is configured to operate as a capacitor, resistor or inductor.

17. A semiconductor device, comprising:
    a conductive layer;
    a first conductive z-interconnect structure including a first inner polymer core formed in contact with the conductive layer;
    a second conductive z-interconnect structure including a second inner polymer core formed in contact with the conductive layer; and
    a semiconductor die disposed between the first conductive z-interconnect structure and second conductive z-interconnect structure and contacting the conductive layer.

18. The semiconductor device of claim 17, wherein the first inner polymer core includes a prolate spheroid shape.

19. The semiconductor device of claim 17, further including:
- an encapsulant deposited around the first conductive z-interconnect structure and second conductive z-interconnect structure; and
- a build-up interconnect layer formed over a surface of the encapsulant and electrically connected to the first conductive z-interconnect structure and second conductive z-interconnect structure.

20. The semiconductor device of claim 19, further including an integrated passive device formed in the build-up interconnect layer.

* * * * *